(12) United States Patent
Yoo et al.

(10) Patent No.: US 9,349,472 B2
(45) Date of Patent: May 24, 2016

(54) FLASH MEMORY DEVICE WITH SENSE-AMPLIFIER-BYPASSED TRIM DATA READ

(71) Applicant: Integrated Silicon Solution, Inc., Milpitas, CA (US)

(72) Inventors: Sung Jin Yoo, San Jose, CA (US); HanKook Kang, Seongnam-si (KR)

(73) Assignee: Integrated Silicon Solution, Inc., Milpitas, CA (US)

( * ) Notice: Subject to any disclaimer, the term of this patent is extended or adjusted under 35 U.S.C. 154(b) by 115 days.

(21) Appl. No.: 14/225,190

(22) Filed: Mar. 25, 2014

(65) Prior Publication Data

US 2015/0279473 A1 Oct. 1, 2015

(51) Int. Cl.
*G11C 17/16* (2006.01)
*G11C 16/28* (2006.01)
*G11C 16/20* (2006.01)

(52) U.S. Cl.
CPC ............. *G11C 16/28* (2013.01); *G11C 16/20* (2013.01)

(58) Field of Classification Search
CPC ...................................... G11C 17/16
USPC .......................................... 365/96
See application file for complete search history.

(56) References Cited

U.S. PATENT DOCUMENTS

| | | | |
|---|---|---|---|
| 2008/0025118 A1* | 1/2008 | Scheuerlein | G11C 11/56 365/201 |
| 2012/0120733 A1* | 5/2012 | Son | G11C 17/14 365/189.02 |
| 2014/0071726 A1* | 3/2014 | Chung | G11C 15/04 365/49.17 |
| 2014/0133229 A1* | 5/2014 | Kamei | G11C 16/0483 365/185.11 |

* cited by examiner

*Primary Examiner* — Min Huang
(74) *Attorney, Agent, or Firm* — Van Pelt, Yi & James LLP

(57) ABSTRACT

A non-volatile memory device includes a two-dimensional array of non-volatile memory cells where a first portion of memory cells being configured as an one-time-programmable memory area; a bypass read-out circuit configured to sense a signal level on a bit line in response to a memory cell in the one-time-programmable memory area being selected and to generate a first signal indicative of the signal level on the bit line; and a trim data latch circuit having an input terminal configured to receive the first signal. The trim data latch circuit is configured to store a signal related to the first signal as a trim data value and to provide trim data value to circuitry of the non-volatile memory device. The trim data value may be applied to adjust a signal level of the circuitry of the non-volatile memory device.

13 Claims, 6 Drawing Sheets

FLASH MEMORY DEVICE WITH SENSE-AMPLIFIER-BYPASSED TRIM DATA READ

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

The operation of the NVM memory device typically requires specified and stable reference voltage or current to ensure proper circuit operation. Due to fabrication process variations, the voltage or current values generated by the internal or on-chip reference sources often vary from chip to chip. To set the desired operating point for an internal reference source, adjustments to the integrated circuit are performed to fine tune the internal reference source to the desired operating point. The adjustment process is referred to as trimming and the adjustments are typically made through trim bits that are stored on the NVM memory device to set the desired operating point of the internal reference sources.

In NVM memory device, trimming is used not only to adjust internal analog voltage/current levels to the target levels but may also be used for compensating for temperature coefficient, or to enable/disable special internal features. In order to conserve silicon real estate, an NVM memory device often includes a dedicated area of the memory array for storing the trim data. Upon powering up of the NVM memory device, the trim data are read out as in a normal memory read operation and applied to the respective circuitry of the memory device. However, in some cases, it may not be possible to read out correctly the trim data from the NVM memory array upon power-up and before adjustments of the analog levels can be applied.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a flash memory device implements a trim data read out method and circuit that supports two-way read operation of trim data for the flash memory device. The trim data read out circuit enables at least some of the trim data to be read out upon powering up of the NVM memory device. In this manner, critical trimming data values for analog levels of the flash memory device can be read out upon power-up and applied to adjust the operation of certain circuit elements, such as the reference current in the read out circuit of the flash memory device. In some embodiments, with the read out circuit properly trimmed to ensure proper operation, the flash memory device can then continue with the read out of the remaining trim data.

Figure 1:
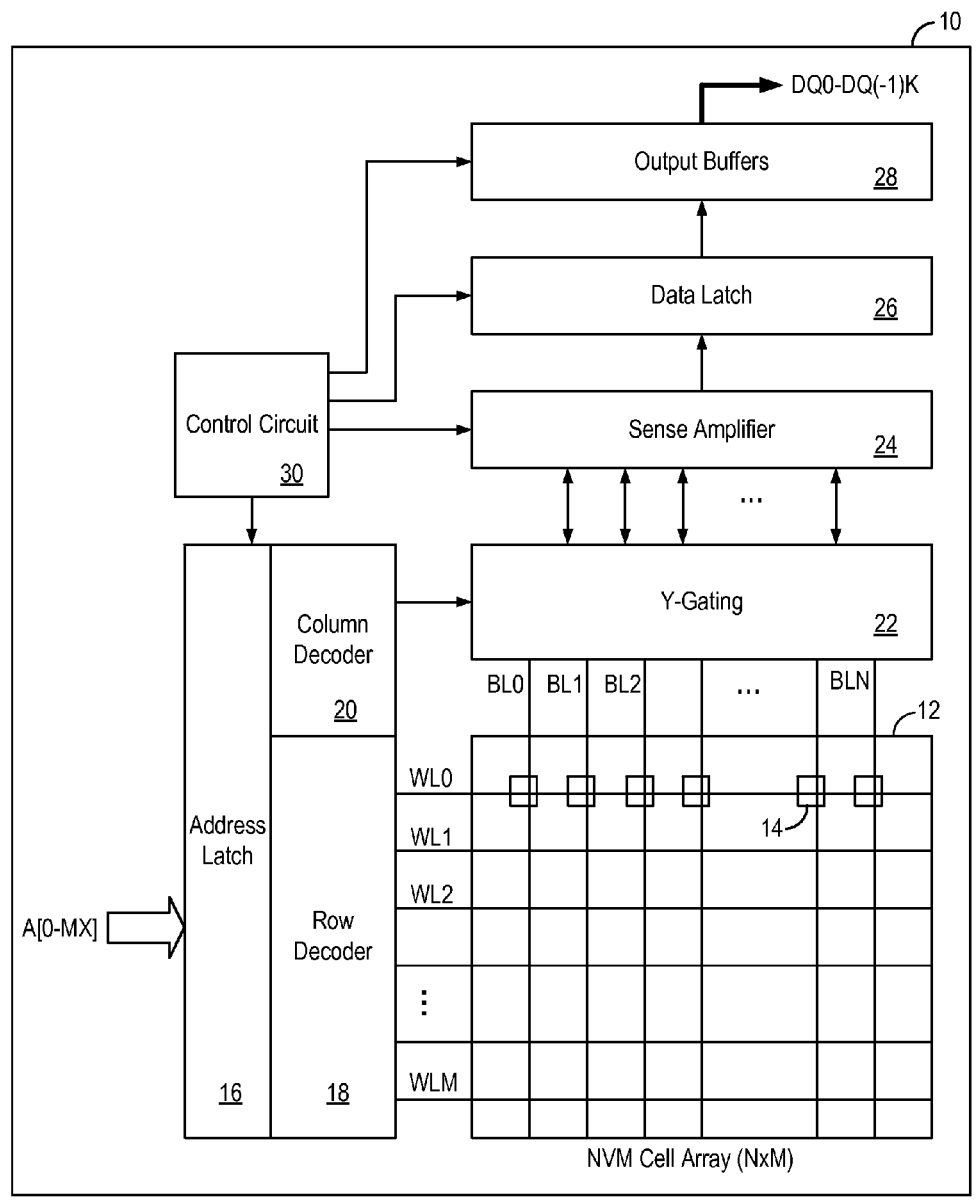
FIG. 1 is a block diagram of a non-volatile memory (NVM) device in one exemplary embodiment.

FIG. 1 is a block diagram of a non-volatile memory (NVM) device in one exemplary embodiment. FIG. 1 is illustrative only and the NVM device may include additional components not shown in FIG. 1. In particular, FIG. 1 illustrates the elements of a NVM device related to the read operation of the memory device. Referring to FIG. 1, the NVM device 10 includes a two-dimensional array 12 of non-volatile memory cells 14. In the present embodiment, NVM device 10 is implemented as a flash memory device and non-volatile memory cells 14 are implemented as flash memory cells. In other embodiments, the NVM device 10 may be implemented as other types of non-volatile memory device.

In embodiments of the present invention, flash memory cells 14 may be configured as a NAND flash memory array or a NOR flash memory array. The memory array 12 is addressed by a row decoder 18 and a column decoder 20 to selectively access the memory cells 14 for read, program (write) and erase operations. In particular, an address A[0-MX] is received at an address latch 16 and the received address is decoded by the row decoder 18 which selects the word lines and the column decoder 20 which selects the bit lines of the memory array 12. The flash memory cells 14 in the array 12 are accessed by word lines WL0 to WLM and bit lines BL0 and BLN. The row decoder 18 selectively activates a word line from WL0 to WLM. The column decoder selectively activates a bit line from BL0 to BLN through the Y-gating circuit 22 to allow a memory cell 14 at the intersection of the selected word line and selected bit line to be accessed. To read data from the memory array 12, the Y-gating circuit 22 connects the selected bit lines to a sense amplifier 24. In practice, the sense amplifier 24 includes a bank of sense amplifiers (or sense amplifier circuits), one sense amplifier for each input/output (I/O) of the flash memory device. Each sense amplifier is coupled to a block of memory cells 14 in the memory array 12. For example, when the flash memory device 10 generates output data in K-bit (i.e. K-bit I/O), the sense amplifier 24 may include K sense amplifier circuits, each sense amplifier circuit being coupled through the Y-gating circuit 22 to a block of bits lines associated with a databit of the output data. The sense amplifier 24 may be coupled to a data latch 26 to store the data read out of the memory array 12. The data latch 26 is coupled to output buffers 28 configured to provide the data read out DQ0 to DQ(K−1) to external circuits. A control circuit 30 is configured to control the operation of the decoders, the sense amplifier, the data latch and the output buffers. The memory architecture shown in FIG. 1 is illustrative only and it will be appreciated that the structure and methods described herein may be utilized in other memory architectures.

Figure 2:
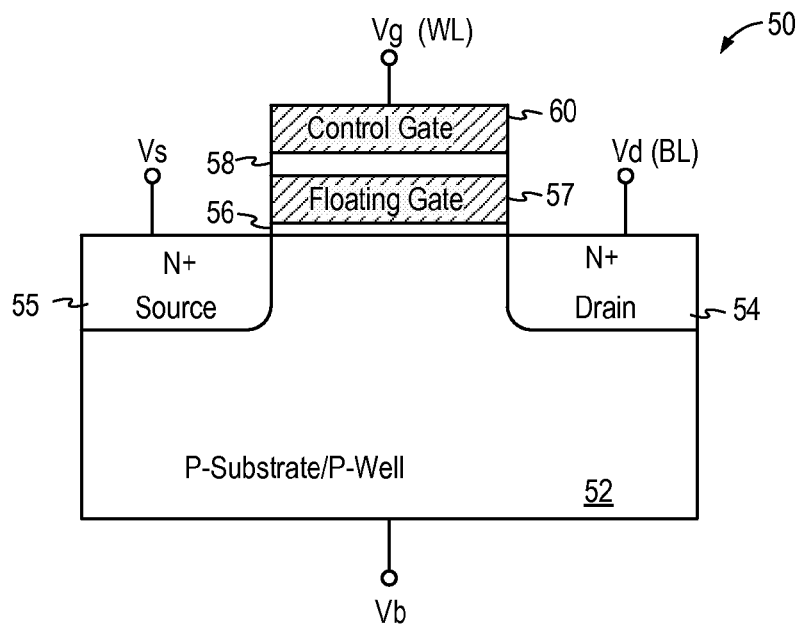
FIG. 2 is a cross-sectional view of a flash memory cell implemented using a floating gate MOS transistor device in some examples of the present invention.

In the present embodiment, flash memory cells 14 are implemented using a floating gate MOS transistor device, as shown in FIG. 2. Referring to FIG. 2, a floating gate MOS transistor device 50 includes a source region 55, a drain region 54, a control gate 60 and a floating gate 57. The source and drain regions are formed in a semiconductor layer 52 with the channel region disposed in between the source and the drain regions. In some examples, the semiconductor layer 52 can be a well region or a semiconductor substrate. In the present example, the floating gate MOS transistor device 50 is formed as an N-type device and the semiconductor layer 52 is a P-type well region with the source and drain regions being heavily doped N+ regions formed in the P-well region 52. The floating gate 57 and the control gate 60 are vertically disposed above the channel region and at least partially overlapped. The floating gate 57 is electrically isolated from the P-type well region 52 by a thin gate oxide layer 56 (also referred to as the "tunnel oxide layer") and is electrically isolated from the control gate 60 by another dielectric layer 58 which can be a dielectric film or a stack of different dielectric films. The control gate 60 of the floating gate MOS transistor device 50 is coupled to the word line of the memory array while the drain region is coupled to the bit line of the memory array. In a NOR flash memory, the source regions of the floating gate MOS transistor devices are connected to a shared source line which is typically connected to the ground potential.

The operation of the flash memory device 10 and the floating gate flash memory cell 50 is well known and will be described in brief. In the present example, the flash memory cell is adapted to store one bit of data. The flash memory cell has a logical state of "1" when the cell is erased and a logical state of "0" when the cell is programmed. It is understood that flash memory cells may be constructed to operate in the opposite logical states.

First, programming or writing data to the flash memory cell is performed by transferring charge carriers from the semiconductor layer 52 to the floating gate 57 by tunneling through the thin gate oxide layer 56. For example, an elevated gate voltage (e.g. Vg=12V) is applied to the control gate to turn on the channel and electrons can flow from the source to the drain. The P-well region 52 is typically grounded. An elevated drain voltage (e.g. Vd=5V) is applied to the drain region 54 relative to the source region 55 to generate electrons with sufficiently high energy ("hot electrons") so that hot electronic injection occurs and hot electrons jump through the thin gate oxide layer 56 onto the floating gate 57. When the biasing voltages are removed, the charges are trapped on the floating gate 57 and the memory cell is programmed to a logical state of 0.

Second, erasing the flash memory cell is performed by transferring charge carriers from the floating gate to the semiconductor layer 52 (or P-well 52) by quantum tunneling or Fowler-Nordheim tunneling. The erase operation can be carried out using source erase operation or channel erase. To perform source erase, an elevated negative voltage (e.g. Vg=−10V) is applied to the control gate 60 and the substrate is at ground. A positive voltage (e.g. Vs=6V) is applied to the source region 55 with the drain region 54 being grounded or floating. Electrons are pulled off the floating gate into the source through quantum tunneling. When the floating gate is left with no charge carriers, the memory cell has a logical state of 1. To perform channel erase, an elevated negative voltage (e.g. Vg=−8V) is applied to the control gate 60 and a positive voltage (e.g. Vb=8V) is applied to the semiconductor layer or P-well 52. The source region 55 and the drain region 54 are left floating. Electrons are pulled off the floating gate into the substrate through quantum tunneling. When the floating gate is left with no charge carriers, the memory cell has a logical state of 1.

Flash memory cells can be programmed individually but are usually erased as a block or a sector. Each erase operation includes the application of an erase pulse followed by an erase verify cycle to ensure that all memory cells are indeed erased. If some of the memory cells are not erased, then another erase pulse is applied and the process repeats until all memory cells are erased. In both source erase and channel erase operations, the magnitude and the duration of the voltage bias can vary and are selected to ensure that all memory cells in a sector a block are erased. In most cases, the flash memory device is erased using a repeated erase-verify operation when the memory cells are verified to be erased after an erase cycle and the erase cycle is repeated if not all memory cells are erased.

Finally, a flash memory cell is read by applying a gate voltage that is an intermediate threshold voltage of an erased memory cell and a programmed memory cell. When a flash memory cell is erased, the floating gate carries no charge and the memory cell transistor can be turned on by the application of a first threshold voltage. However, when the flash memory cell is programmed, the negative charge on the floating gate screens the electric field from the control gate, the memory cell transistor thus requires a second threshold voltage higher than the first threshold voltage to turn on. Thus, to read a flash memory cell, a gate voltage between the first and second threshold voltages are applied to the control gate and a drain voltage, smaller than the gate voltage, is applied to the drain. If a current is measured at the drain terminal, then the memory cell is not programmed and has a logical state of 1. If no current is measured at the drain terminal, then the memory cell is programmed and has a logical state of 0.

To access a flash memory cell in the memory array 12, an input address A[0-MX] (FIG. 1) is provided to flash memory device 10. The input address is latched by the address latch 16 and the latched address is divided into a row address which is coupled to the row decoder 16 and a column address which is coupled to the column decoder 18. Row decoder decodes the row address and activates one word line out of word lines WL0 to WLM and column decoder decodes the column address and activates one bit line out of bit lines BL0 to BLN.

In this manner, the memory cell associated with the activated word line and the activated bit line is made available for either read, write or erase operation. In practice, the flash memory device activates the memory cells associated with all of the I/Os of the memory device. For example, the memory cells associated with one byte of data or eight I/Os, may be activated for access based on the input address. More specifically, the conventional flash memory device activates one bit line for each associated sense amplifier in the flash memory device. In the following description, the operation of the flash memory device will be described with reference to a single sense amplifier or a single I/O. It is understood that the flash memory device includes a bank of sense amplifiers for a set of I/Os, such as a byte of data.

In the flash memory device 10, to read out data from a flash memory cell 14, a memory cell is selected by activating a respective word line and a respective bit line and the current that flows in the memory cell is measured. The current that flows through the memory cell is measured at the drain terminal which is coupled to the bit line. The amount of current that flows through the selected memory cell is a function of the logical state of the memory cell. In the present example, if a current is measured at the drain terminal, then the memory cell is not programmed and has a logical state of 1. On the other hand, if no current is measured at the drain terminal, then the memory cell is programmed and has a logical state of 0. In the present description, the current that flows through a memory cell during a read operation is referred to as the "cell current" or the "bit line current." The current that flows through the memory cell during a read operation is measured by the sense amplifier 24.

The operation of the flash memory device 10 typically requires specified and stable reference voltage or current to ensure proper circuit operation. Due to fabrication process variations, the voltage or current values generated by the internal or on-chip reference sources often vary from chip to chip. In some cases, the reference voltage or current values may have temperature coefficients that need to be corrected. Furthermore, the flash memory device may include specific internal programmable features that may be selected by programming of certain internal voltage levels. Accordingly, flash memory device 10 employs trimming to adjust internal analog voltage/current levels to target levels, to compensate for temperature coefficient, or to enable/disable special internal programmable features. To that end, flash memory device 10 includes a storage area configured to store trim data values to be applied for the circuitry of the flash memory device. In the present description, the term "trim data" or "trim data values" refer to data values used for setting reference voltage/current values to target values, for setting temperature compensation values, as well as used to enable/disable internal features of the flash memory device. Although a separate memory array may be provided on the flash memory device for storing the trim data, to conserve silicon real estate, most flash memory devices designate a portion of the memory array for storing the trim data.

Figure 3:
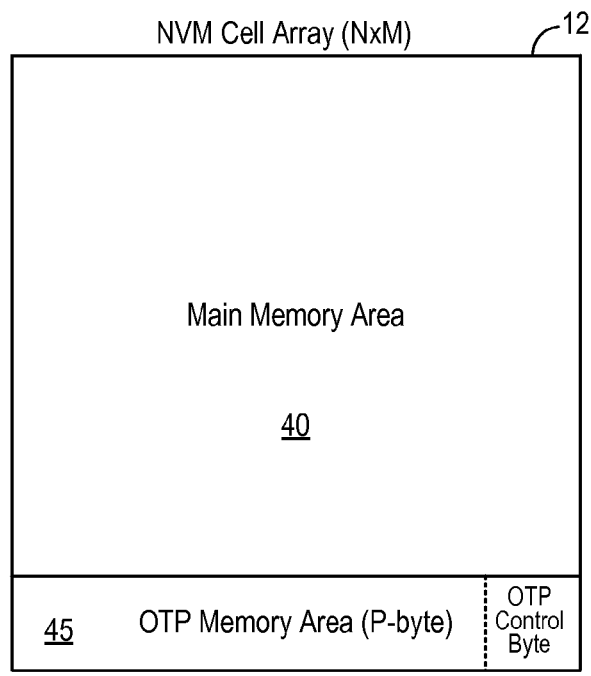
FIG. 3 illustrates a flash memory array configuration where a portion of the memory cells is designated as an OTP (one-time programmable) memory array for storing trim data.

FIG. 3 illustrates a flash memory array configuration where a portion of the memory cells is designated as an OTP (one-time programmable) memory array for storing trim data. In the example shown in FIG. 3, the flash memory device designates a portion 45 of the memory array 12 as an one-time programmable (OTP) memory area. Thus, the memory array 12 includes a main memory area 40 for storing data and an OTP memory area 45 for storing trim data. The OTP memory area 45 may include P-bytes of memory cells, such as 256 bytes. An OTP control byte is used to permanently lock the OTP memory area after trimming data are stored therein. For example, one or more databits in the OTP control byte may be set to a first state to allow the memory cells in the OTP memory area 45 to be programmed. When the relevant databits of the OTP control byte are set to a second state opposite the first state, the OTP memory area becomes read-only and cannot be programmed again. For instance, once the relevant databits in the OTP control byte is set to the second state, those data bits cannot be set back to the first state again. Thus, once the relevant databits in the OTP control byte is set to the second state, the entire OTP memory area becomes read-only in a permanent way. Any program or erase cycle applied to the OTP memory area thereafter is rejected.

When the flash memory device is powered up, the control circuit of the flash memory device operates to read out the trim data first so as to configure circuitry or select internal programmable features for the flash memory device before the flash memory device commences normal operation. When a portion of the flash memory array is used to store the trim data, the read out of the trim data uses the same read operation of the flash memory cells. However, in some cases, it may not be possible to use the normal flash memory read operation to read out the trim data before adjustments of the analog levels are applied. For example, the reference current level for the sense amplifier used in the read operation may have an associated trim value to ensure proper sensing of the bit line current. Before the trim value to the reference current is applied to the sense amplifier, the sense amplifier may not operate correctly and the bit line current cannot be read out correctly. Thus, while using a portion of the flash memory array for storing trim data saves silicon real estate, there is a problem of the trim data not being able to be read out reliably during power up of the flash memory device.

Figure 4:
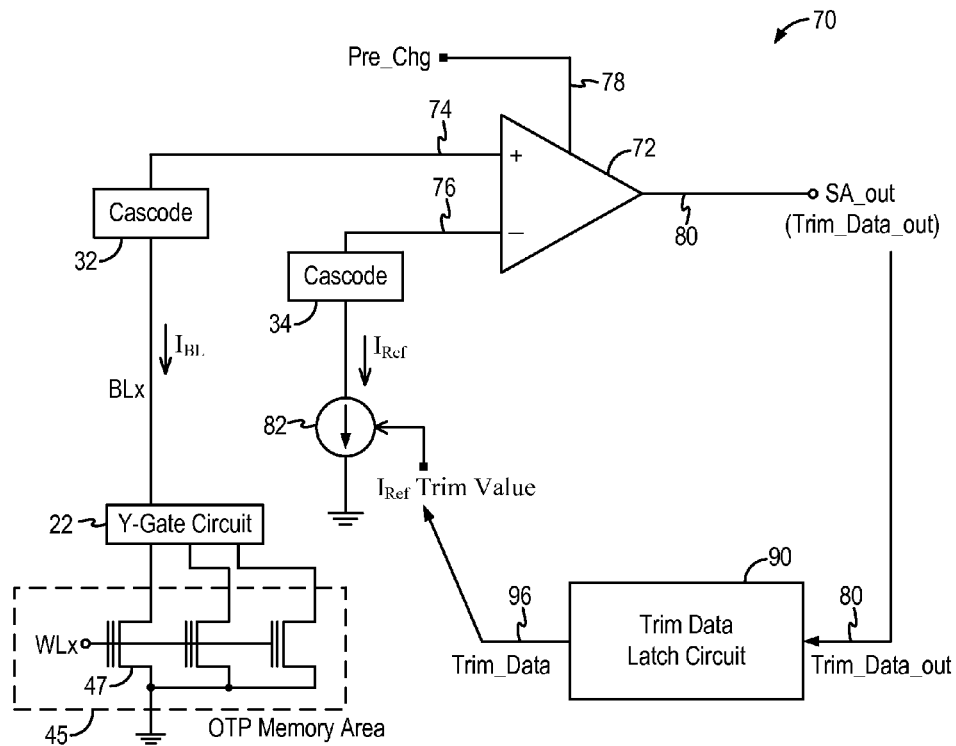
FIG. 4 illustrates the conventional trim data read out method used to read out trim data stored in the OTP memory area of the memory array in the flash memory device of FIG. 1.

FIG. 4 illustrates the conventional trim data read out method used to read out trim data stored in the OTP memory area of the memory array in the flash memory device of FIG. 1. Referring to FIG. 4, in the conventional trim data read out method, the trim data stored in the memory cells in the OTP memory area 45 are read out using the normal flash memory cell read out operation. For example, a memory cell is selected by activating the selected word line WLx and the selected bit line (through the Y-Gate Circuit 22). A sense amplifier 70 is configured as a differential amplifier 72 to sense and amplify a difference between the bit line current $I_{BL}$ of a selected flash memory cell 47 and a reference current $I_{Ref}$. Typically, a cascode amplifier 32 is coupled to the bit line to convert the cell current to a bit line voltage value (node 74) and a cascode amplifier 34 is coupled to the reference current source 82 to convert the reference current to a reference voltage value (node 76). The sense amplifier 72 senses the two voltage values and generates a sense amplifier output signal SA_out (node 80) indicative of the current differential at its input terminals 74, 76. The selected flash memory cell 47 may be associated with the word line WLx and the bit line BLx in the OTP memory area 45. In the present example, the reference current $I_{Ref}$ that is generated by a reference current source 82. Due to fabrication process variations or other factors, the reference current $I_{Ref}$ may have variations from chip to chip or may have certain undesired temperature coefficient. Thus, the reference current source 82 receives a reference current trim value ($I_{Ref}$ trim value) to set the reference current $I_{Ref}$ to the target value desired for the correct read out operation.

In the conventional trim data read out method, during power up of the flash memory device, trim data from the OTP memory area 40 are read out through the sense amplifier 70 and then provided to a trim data latch circuit 90. In the present description, when the sense amplifier 70 is reading out trim data, the sense amplifier output SA_out will be referred to as Trim_Data_out. When the trim data is read out by the sense amplifier 70, the sense amplifier output signal Trim_Data_out (node 80) is provided to the trim data latch circuit 90 which stores the trim data. With the trim data thus stored, the trim data latch circuit 90 provides the trim data as an output signal to drive the respective circuit elements or control registers in the flash memory device. In the present example, the trim data (Trim_Data) stored in the trim data latch circuit 90 is provided to the reference current source 82 as the reference current trim value.

When the conventional trim data read out method is used, the trim data has to be read out using the normal flash memory read operation first and then the trim data can be used to adjust internal analog levels to their target levels or to set internal programmable features. However, the normal flash memory read operation relies on the reference current $I_{Ref}$ being properly trimmed. Meanwhile, the reference current $I_{Ref}$ cannot be properly trimmed until the trim data is read out. Thus, the conventional trim data read out method may not function in cases where the trim data is not able to be reliably read out before the analog levels of the read out circuitry are set by the trim values.

Figure 5:
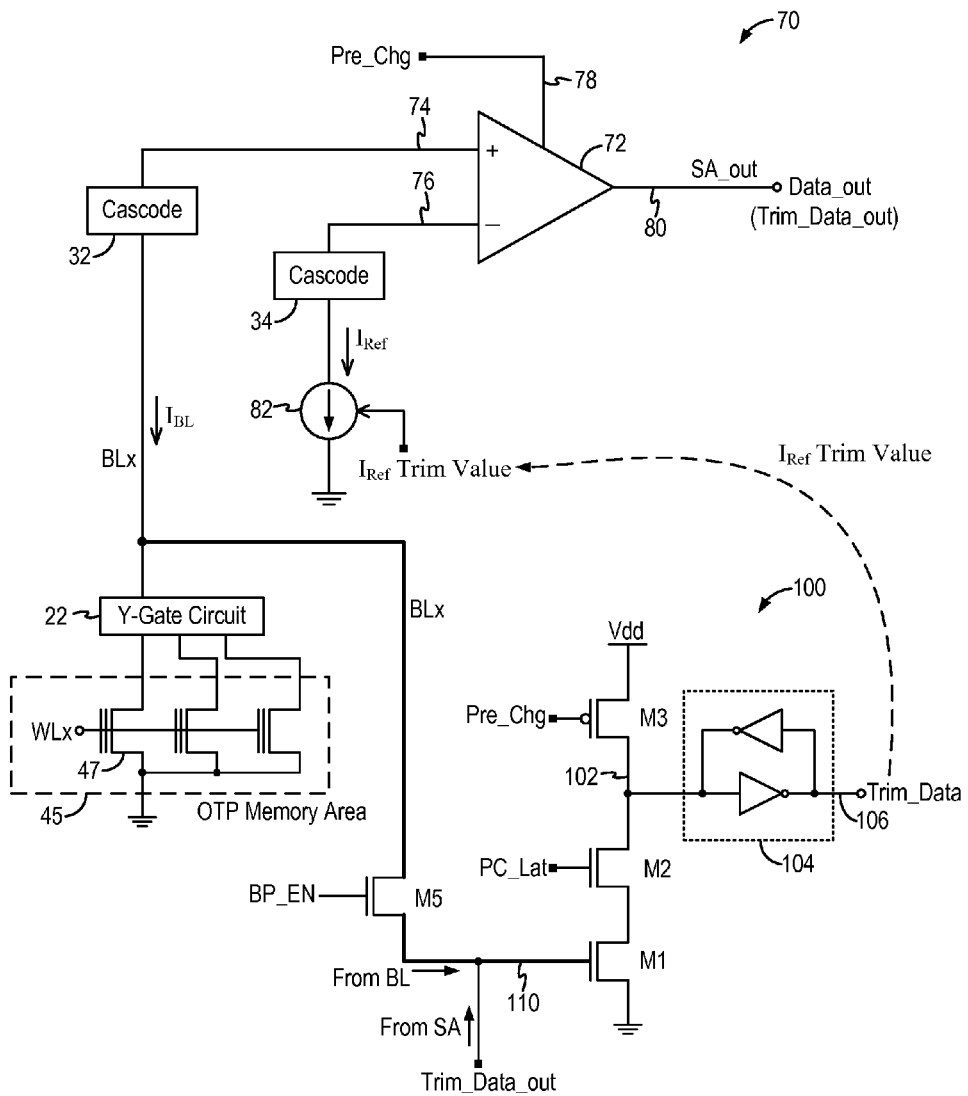
FIG. 5 illustrates a trim data read out method and circuit configured to read out trim data stored in the OTP memory area of the memory array in the flash memory device of FIG. 1 in embodiments of the present invention.

FIG. 5 illustrates a trim data read out method and circuit configured to read out trim data stored in the OTP memory area of the memory array in the flash memory device of FIG. 1 in embodiments of the present invention. More specifically, a trim data read out method and circuit is configured to provide two-way read operation of trim data stored in the OTP memory area of the memory array so that at least part of the trim data can be read out reliably even before the internal circuitry have been adjusted by the trim data values.

First, the trim data read out method and circuit implements the conventional trim data read out method. In particular, trim data stored in memory cells 47 in the OTP memory area are read through the sense amplifier 70 which compares a voltage related to the bit line current on the selected bit line BLx to a voltage related to the reference current $I_{Ref}$ generated by the reference current source 82. The sense amplifier output (node 80), providing the Trim_Data_out signal value, is coupled to an input terminal 110 of a trim data latch circuit 100. The trim data read out from the sense amplifier is then stored in the trim data latch circuit 100.

In the first way of trim data read out, the trim data are read out through the sense amplifier 70 using the normal flash memory read operation and then the trim data are latched by the trim data latch circuit 100. As described above, in some cases, this method of trim data read out is unreliable as certain critical analog levels of the read out circuit, such as the reference current used by the differential amplifier 72 of the sense amplifier, are not yet trimmed by the respective trim values and thus normal flash memory read operation cannot be performed correctly.

According to embodiments of the present invention, the trim data read out method and circuit provides a second way to read out trim data from the OTP memory area. In particular, the trim data read out method and circuit incorporates a second way of reading out the trim data value from the memory cells in the OTP memory area 45 which accesses the bit line directly and bypasses the sense amplifier. In the present description, the second way of reading out the trim data value in accordance with embodiments of the present invention will be referred to as the "trim data bypass read out method." By using the trim data bypass read out method, at least some of the trim data can be read out and stored in the trim data latch circuit 100, regardless of the operational state of the sense amplifier 70. In some embodiments, the control circuit is configured to use the trim data bypass read out method to read out trim data that are critical to the flash memory cell read operation. For example, the control circuit is configured to use the trim data bypass read out method to read out trim data for the reference current level of the sense amplifier. In this manner, the reference current source providing the reference current can receive the necessary trim data and the reference current for the sense amplifier can be adjusted to the target level so that normal flash memory read out operation can be performed correctly. After the read circuitry of the flash memory device is properly adjusted using the read-out trim data values, the control circuit of the flash memory device can continue to read out the remaining trim data using the normal memory cell read out operation, that is, read out through the sense amplifier.

Referring back to FIG. 5, in embodiments of the present invention, the trim data read out circuit of the present invention includes a bypass read-out transistor M5 having a drain terminal coupled to the selected bit line BLx and a source terminal coupled to the input terminal 110 of the trim data latch circuit 100. Bypass read-out transistor M5 is controlled by a bypass_enable signal BP_EN to form a bypass read-out path. The bypass_enable signal BP_EN is asserted when a power-up reset condition is initiated at the flash memory device. The bypass enabled signal BP_EN is asserted to turn on the bypass read-out transistor M5, thereby enabling the bypass read-out path, to read out the trim data value from the bit line BLx though the bypass read-out path when the memory cell containing the trim data value is activated. The bypass_enable signal BP_EN is deasserted to turn off the bypass read-out transistor M5 when the trim data is latched by the trim data latch circuit 100.

In the present embodiment, the trim data latch circuit 100 includes transistors M1, M2 and M3 connected in series between the power supply voltage Vdd and ground. PMOS Transistor M3 receives the precharge signal Pre_Chg and is configured to precharge the latch node 102 to the Vdd potential. NMOS Transistor M2 is configured to isolate the latch node 102 after the trim data has been latched. NMOS transistor M1 has its gate terminal coupled to the input terminal 110 of the trim data latch circuit 100. Thus, the transistor M1 is either driven by the output of the sense amplifier (node 80) or the source terminal of the bypass read-out transistor M5. The trim data latch circuit 100 further includes a storage element 104, such as a register. In the present example, the storage element 104 is implemented as a pair of back-to-back connected inverters. The data value at the latch node 102 is stored or latched by the storage element 104 when transistor M2 is turned on. The stored trim data value is then available on an output terminal 106 of the trim data latch circuit 100.

Figure 6:
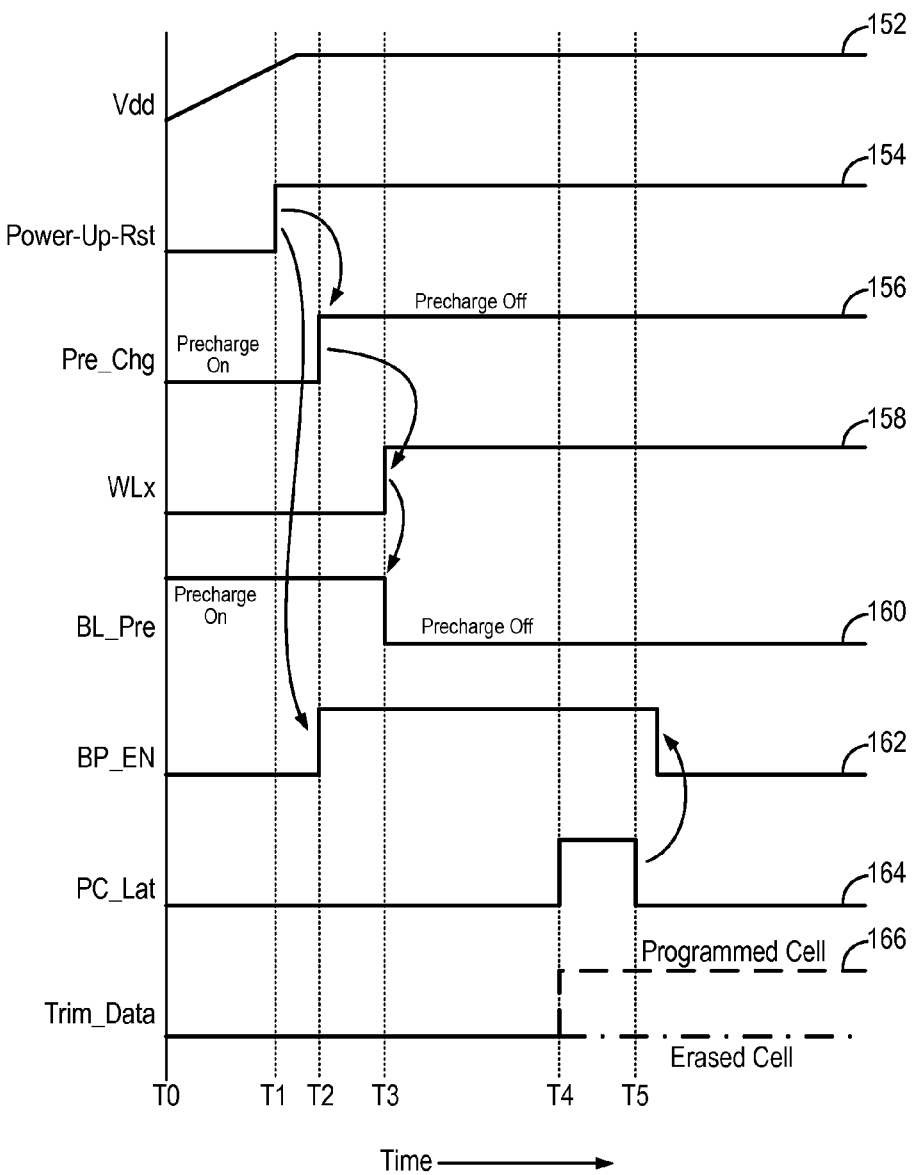
FIG. 6 is a timing diagram illustrating signal waveforms of the flash memory device of FIGS. 1 and 5 in embodiments of the present invention.

The operation of the trim data bypass read out method will now be explained with reference to the timing diagram of FIG. 6. FIG. 6 is a timing diagram illustrating signal waveforms of the flash memory device of FIGS. 1 and 5 in embodiments of the present invention. Some of the signals shown in FIG. 6 are part of the flash memory device of FIG. 1 and may not appear on the read-out circuit diagram of FIG. 5.

First, as the flash memory device is being powered up and the power supply voltage Vdd rises (curve 152), the power-up-reset signal (curve 154) is asserted (time T1). Meanwhile, as the power supply voltage Vdd rises, the precharge signal Pre_Chg and a bit line precharge signal BL_Pre are in an asserted state to precharge nodes and circuitry of the flash memory device. In the present illustration, the precharge signal Pre_Chg (curve 156) is an active low signal to drive one or more PMOS precharge transistors and the bit line precharge signal BL_Pre (curve 160) is an active high signal to drive one or more NMOS precharge transistors associated with the bit lines. The logical levels used in FIG. 5 are illustrative only and it is understood that the trim data bypass read out method of the present invention can be implemented using opposite logical levels depending on the configuration of the circuit elements in the flash memory device.

More specifically, the control circuit of the flash memory device activates the precharge signal Pre_Chg to precharge certain nodes to prepare the flash memory read circuitry for the read operation. For example, the precharge signal Pre_Chg is coupled to an input node 78 of the differential amplifier 72 to precharge the internal nodes of the differential amplifier. The precharge signal Pre_Chg is also coupled to the trim data latch circuit 100 to turn on transistor M3 so as to precharge the latch node 102. Furthermore, the control circuit of the flash memory device activates the bit line precharge signal BL_Pre to precharge the selected bit line BLx to the Vdd potential.

With the assertion of the power-up reset signal, the precharge signal Pre_Chg is deasserted (time T2) so that precharging at the differential amplifier 72 and at the latch node 102 is terminated. That is, transistor M3 is turned off. Also with the assertion of the power-up reset signal, the bypass_enable signal BP_EN (curve 162) is asserted to turn on bypass transistor M5. The bypass read-out path is thus enabled.

With the pre-charge signal Pre_Chg being deactivated, the selected word line WLx (curve 158) is activated while the bit line precharge signal BL_Pre is deasserted (time T3). At this time, the latch control signal PC_Lat (curve 164), driving the gate of transistor M2, remains deasserted. Transistor M2 is turned off and the latch node 102 remains at the precharged voltage level, such as the power supply Vdd level. The stored trim data value Trim_Data (curve 166) has an inverted logical value as the latch node 102 and thus is at a logical low value.

When the word line WLx is asserted, a memory cell 47 is selected for access and a cell current $I_{BL}$ flows in the bit line associated with the selected the memory cell. The cell current also flows to the bypass read-out path through transistor M5 to the gate (node 110) of transistor M1. A given time after the assertion of the word line, the latch control signal PC_Lat is asserted to turn on transistor M2 (time T4). The transistor M1 is controlled by the signal at the input terminal 110. In the event that the sense amplifier 70 is not yet operational due to the lack of analog level adjustment, the cell current signal coming through the bypass read-out path of transistor M5 controls the gate of transistor M1.

Accordingly, with the bit line BLx precharged, when the selected memory cell is erased (logical state of "1"), the selected memory cell will pull down on the bit line BLx and transistor M5 will then drive the input terminal 110 to ground. Transistor M1 is then turned off and the latch node 102 is maintained at the precharged potential, such as Vdd. The stored data value Trim_Data (curve 166) remains at the same logical level as in the precharged state. That is, the stored data value Trim_Data (curve 166) remains at a logical low value when the selected memory cell is in an erased state.

On the other hand, when the selected memory cell is programmed (logical state of "0"), the selected memory cell will not pull down on the bit line BLx and transistor M5 will then drive the input terminal 110 of transistor M1 to the Vdd potential. Transistor M1 is then turned on and since transistor M2 is also turned on, the latch node 102 is pull down to the ground potential. The data value stored in the storage element 104 is then switched to the opposite logical state. That is, the stored data value Trim_Data (curve 166) switches to a logical high value when the selected memory cell is in a programmed state.

After the trim data is latched into the storage element 104, the latch control signal PC_Lat is deasserted (time T5) and the bypass enable signal BP_EN is also deasserted. In this manner, the trim data stored in the memory cells in the OTP memory area can be read out and stored in the trim data latch circuit 100 without using the sense amplifier 70. The read-out trim data can then be applied to respective circuitry of the flash memory device, such as to adjust the reference current level of the sense amplifier.

With the sense amplifier properly trimmed, the flash memory device can then use the normal flash memory read operation to read out remaining trim data. With the BP_EN signal being deasserted, bypass read-out transistor M5 is turned off so that input terminal 110 receives only the sense amplifier output signal. The trim data latch circuit 100 will receive the sense amplifier output Trim_Data_out on its input terminal 110 and will latch the trim data received from the sense amplifier into the storage element.

In FIG. 5, a single trim data latch circuit is shown. In practice, the flash memory device includes multiple trim data latch circuit with storage elements for storing all of the trim data values. In some embodiments, the flash memory device employs 256 byte of trim data and 256×8 trim data latch circuits are provided for storing each databit of the trim data value.

Figure 7:
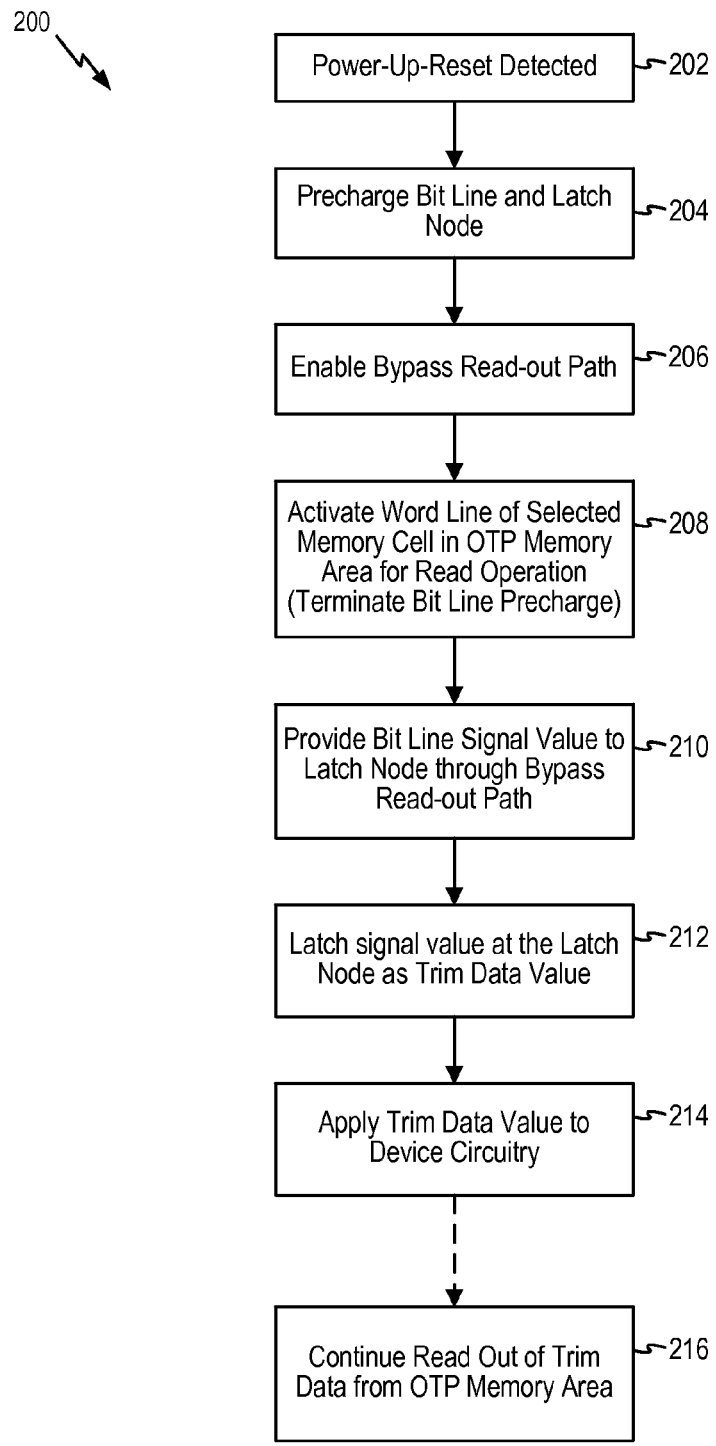
FIG. 7 is a flow chart illustrating the trim data bypass read out method in embodiments of the present invention.

FIG. 7 is a flow chart illustrating the trim data bypass read out method in embodiments of the present invention. Referring to FIG. 7, the trim data bypass read out method 200 starts at 202 where a power-up-reset condition is detected. The method 200 then precharges a selected bit line and a latch node to a first potential, typically the positive power supply potential (204). In some embodiments, the bit line may be precharged through the sense amplifier and the latch node may be precharged through the trim data latch circuit. At 206, the method 200 enables the bypass read-out path. At 208, the method 200 activates the word line of the selected memory in the OTP memory for read operation. The precharge operation for the bit line and the latch node has terminated. With the word line being activated, the stored data value in the selected memory cell will appear on the bit line. When the stored data value has a logical state of "1", the bit line will be discharged. When the stored data value has a logical state of "0", the bit line will remain charged.

At 210, the method 200 provides the bit line signal value to the latch node through the bypass read-out path. For example, the bit line signal value can be coupled to the latch node through a transistor. The latch node either maintains the precharged voltage level or is discharged by the bit line signal value. At 212, the method 200 latches the signal value at the latch node as trim data value. At 214, the method 200 applies the trim data value to adjust device circuitry. In some embodiments, method 200 may continue to read out trim data from the OTP memory area (216). The method 200 may read out the remaining trim data using the normal flash memory read operation. For example, the trim data may be read out using the sense amplifier.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A non-volatile memory device, comprising:
 a two-dimensional array of non-volatile memory cells, each memory cell being adapted to store one bit of data, each memory cell being accessed by a word line and a bit line, the array comprising a first portion of memory cells being configured as an one-time-programmable memory area;

a bypass read-out circuit configured to sense a signal level on a bit line in response to a memory cell in the one-time-programmable memory area being selected and to generate a first signal indicative of the signal level on the bit line;

a trim data latch circuit having an input terminal configured to receive the first signal, the trim data latch circuit being configured to store a signal related to the first signal as a trim data value and to provide trim data value to circuitry of the non-volatile memory device, the trim data value being applied to adjust a signal level of the circuitry of the non-volatile memory device; and a sense amplifier configured to receive a signal indicative of a reference current and further to receive a signal indicative of a bit line current in response to a memory cell being selected for access by activating the respective word line and the respective bit line, the sense amplifier being configured to sense the difference between the bit line current flowing in the selected memory cell and the reference current and to generate an output signal indicative of the difference, wherein in response to a memory cell in the one-time-programmable memory area being selected, the input terminal of the trim data latch circuit is further configured to receive the first signal in response to the bypass read-out circuit being enabled and to receive the output signal of the sense amplifier in response to the bypass read-out circuit being disabled.

2. The non-volatile memory device of claim 1, wherein the trim data value comprises a trim data value to adjust an analog signal level of the circuitry of the non-volatile memory device, or a trim data value to compensate for temperature coefficient of the circuitry of the non-volatile memory device, or a trim data value to select a programmable feature of the non-volatile memory device.

3. The non-volatile memory device of claim 1, wherein the trim data value comprises a trim data for the reference current of the sense amplifier, the trim data value being applied to adjust the reference current to a target current level.

4. The non-volatile memory device of claim 1, wherein the bypass read-out circuit comprises a first transistor having a control terminal configured to receive a control signal, a first current handling terminal configured to sense the signal level of the bit line and a second current handling terminal configured to provide the first signal.

5. The non-volatile memory device of claim 1, wherein the bypass read-out circuit is activated to generate the first signal indicative of the signal level on the bit line after the initiation of a power-up-reset condition of the non-volatile memory device.

6. A non-volatile memory device, comprising:

a two-dimensional array of non-volatile memory cells, each memory cell being adapted to store one bit of data, each memory cell being accessed by a word line and a bit line, the array comprising a first portion of memory cells being configured as an one-time-programmable memory area;

a sense amplifier configured to receive a signal indicative of a reference current and further to receive a signal indicative of a bit line current in response to a memory cell being selected for access by activating the respective word line and the respective bit line, the sense amplifier being configured to sense the difference between the bit line current flowing in the selected memory cell and the reference current and to generate an output signal indicative of the difference;

a trim data latch circuit having an input terminal configured to receive the output signal of the sense amplifier and a second signal, the trim data latch circuit being configured to store the output signal or the second signal and to provide the stored data as trim data for the non-volatile memory device, the trim data being applied to adjust a signal level of the non-volatile memory device; and a bypass read-out circuit configured to sense a signal level on the bit line in response to a memory cell in the one-time-programmable memory area being selected, the bypass read-out circuit providing the sensed signal level to the input terminal of the trim data latch circuit as the second signal.

7. The non-volatile memory device of claim 6, wherein the trim data value comprises a trim data value to adjust an analog signal level of the circuitry of the non-volatile memory device, or a trim data value to compensate for temperature coefficient of the circuitry of the non-volatile memory device, or a trim data value to select a programmable feature of the non-volatile memory device.

8. The non-volatile memory device of claim 6, wherein the bypass read-out circuit is controlled by a control signal, the trim data latch circuit being configured to receive the second signal in response to the bypass read-out circuit being enabled by the control signal and the trim data latch circuit being configured to receive the output signal of the sense amplifier in response to the bypass read-out circuit being disabled by the control signal.

9. The non-volatile memory device of claim 6, wherein the trim data value comprises a trim data for the reference current of the sense amplifier, the trim data value being applied to adjust the reference current to a target current level.

10. The non-volatile memory device of claim 6, wherein the bypass read-out circuit comprises a first transistor having a control terminal configured to receive a control signal, a first current handling terminal configured to sense the signal level of the bit line and a second current handling terminal configured to provide the first signal.

11. The non-volatile memory device of claim 6, wherein the bypass read-out circuit is activated to generate the first signal indicative of the signal level on the bit line after the initiation of a power-up-reset condition of the non-volatile memory device.

12. A method in a non-volatile memory device including an array of memory cells, the method for reading out trim data values stored in an one-time-programmable memory area of the array of memory cells, the method comprising:

detecting the initiation of a power-up-reset condition;
precharging a bit line and a latch node;
enabling a bypass read-out path;
activating a word line associated with a memory cell in the one-time-programmable memory area of the array;
providing a signal level on the bit line to the latch node though the bypass read-out path;
storing a signal value at the latch node as a trim data value; and
applying the trim data value to circuitry of the non-volatile memory device, the trim data value being applied to adjust a signal level of the circuitry of the non-volatile memory device,
wherein applying the trim data value to circuitry of the non-volatile memory device comprises applying the trim data value to adjust a reference current of a sense amplifier of the non-volatile memory device.

13. The method of claim 12, wherein the trim data value comprises a trim data value to adjust an analog signal level of the circuitry of the non-volatile memory device, or a trim data value to compensate for temperature coefficient of the circuitry of the non-volatile memory device, or a trim data value to select a programmable feature of the non-volatile memory device.

* * * * *